US010482817B2

(12) United States Patent
Kim et al.

(10) Patent No.: US 10,482,817 B2
(45) Date of Patent: Nov. 19, 2019

(54) DISPLAY DEVICE AND METHOD FOR DRIVING THE SAME

(71) Applicant: Samsung Display Co., Ltd., Yongin-si (KR)

(72) Inventors: Keunwoo Kim, Seongnam-si (KR); Sooyoung Park, Seoul (KR); Joonghyun Park, Hwaseong-si (KR); Dongwoo Kim, Suwon-si (KR); Kyoung-Ju Shin, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 66 days.

(21) Appl. No.: 15/798,812

(22) Filed: Oct. 31, 2017

(65) Prior Publication Data

US 2018/0158406 A1 Jun. 7, 2018

(30) Foreign Application Priority Data

Dec. 5, 2016 (KR) ........................ 10-2016-0164568

(51) Int. Cl.
*G09G 3/36* (2006.01)
*G09G 3/3233* (2016.01)
(Continued)

(52) U.S. Cl.
CPC ......... *G09G 3/3233* (2013.01); *G09G 3/3283* (2013.01); *G09G 2230/00* (2013.01); *G09G 2300/0426* (2013.01); *G09G 2300/0439* (2013.01); *G09G 2300/0819* (2013.01); *G09G 2300/0842* (2013.01); *G09G 2310/0216* (2013.01); *G09G 2320/0233* (2013.01); *G09G 2320/045* (2013.01); *H05B 33/0896* (2013.01)

(58) Field of Classification Search
CPC ............... G09G 3/36; G09G 3/30; G09G 3/32
See application file for complete search history.

(56) References Cited

U.S. PATENT DOCUMENTS 8,421,090 B2 4/2013 Choi
8,455,876 B2 6/2013 Choi et al.
(Continued)

FOREIGN PATENT DOCUMENTS

JP 2011-115839 6/2011
JP 2015-225104 12/2015
(Continued)

*Primary Examiner* — Pegeman Karimi
(74) *Attorney, Agent, or Firm* — H.C. Park & Associates, PLC

(57) ABSTRACT

A display device includes pixels configured to emit light of various intensity in accordance with driving signals, data lines, scan lines, and a power supply unit configured to supply at least one driving voltage to the pixels. At least one of the pixels may comprise a switching transistor having a first electrode connected to one of the data lines and a second electrode connected to a first node, and a gate electrode connected to one of the scan lines, a driving transistor connected between the power supply unit and an organic light emitting diode, a storage capacitor having a first terminal connected to the first node and a second terminal connected to a gate electrode of the driving transistor, and a first transistor connected between the first node and a first electrode of the driving transistor.

22 Claims, 7 Drawing Sheets

(51) Int. Cl.
*G09G 3/3283* (2016.01)
*H05B 33/08* (2006.01)

(56) References Cited

U.S. PATENT DOCUMENTS

| | | | | |
|---|---|---|---|---|
| 8,759,832 | B2 | 6/2014 | Yang et al. | |
| 8,829,511 | B2 | 9/2014 | Hsieh et al. | |
| 9,147,719 | B2 | 9/2015 | Kim et al. | |
| 9,489,882 | B2 | 11/2016 | Kim et al. | |
| 9,490,276 | B2 | 11/2016 | Kim et al. | |
| 9,530,854 | B2 | 12/2016 | Choi | |
| 9,698,279 | B2 | 7/2017 | Kim | |
| 9,721,509 | B2 | 8/2017 | Kim et al. | |
| 10,176,778 | B2 | 1/2019 | Kim | |
| 2005/0200618 | A1* | 9/2005 | Kim | G09G 3/3233 345/204 |
| 2006/0077134 | A1* | 4/2006 | Hector | G09G 3/3233 345/76 |
| 2008/0143655 | A1* | 6/2008 | Ko | G09G 3/3291 345/82 |
| 2010/0134482 | A1* | 6/2010 | Ogura | G09G 3/3291 345/214 |
| 2010/0182223 | A1 | 7/2010 | Choi et al. | |
| 2013/0069926 | A1* | 3/2013 | Park | G09G 3/3233 345/211 |
| 2015/0055051 | A1 | 2/2015 | Osawa et al. | |
| 2015/0179679 | A1 | 6/2015 | Wi | |
| 2015/0243686 | A1 | 8/2015 | Lee et al. | |
| 2015/0243687 | A1 | 8/2015 | Lee et al. | |
| 2015/0325602 | A1 | 11/2015 | Im | |
| 2016/0043159 | A1* | 2/2016 | Kim | H01L 27/3262 257/71 |
| 2016/0087021 | A1 | 3/2016 | Sato | |
| 2016/0247451 | A1* | 8/2016 | Kim | G09G 3/3258 |
| 2018/0233082 | A1* | 8/2018 | Wang | G09G 3/3233 |

FOREIGN PATENT DOCUMENTS

| | | |
|---|---|---|
| KR | 10-1048965 | 7/2011 |
| KR | 10-1065407 | 9/2011 |
| KR | 10-1073542 | 10/2011 |
| KR | 10-2015-0043075 | 4/2015 |
| KR | 10-2015-0044724 | 4/2015 |
| KR | 10-2015-0051824 | 5/2015 |
| KR | 10-2015-0098281 | 8/2015 |
| KR | 10-2015-0100515 | 9/2015 |
| KR | 10-2015-0100516 | 9/2015 |
| KR | 10-2015-0100566 | 9/2015 |
| KR | 10-2015-0101403 | 9/2015 |
| KR | 10-2015-0101406 | 9/2015 |
| KR | 10-2015-0101408 | 9/2015 |
| KR | 10-2015-0101409 | 9/2015 |
| KR | 10-2015-0101411 | 9/2015 |
| KR | 10-2015-0101412 | 9/2015 |
| KR | 10-2015-0146117 | 12/2015 |
| KR | 10-2016-0027903 | 3/2016 |
| KR | 10-2017-0081801 | 7/2017 |

* cited by examiner

DISPLAY DEVICE AND METHOD FOR DRIVING THE SAME

CROSS-REFERENCE TO RELATED APPLICATION

This application claims priority from and the benefit of Korean Patent Application No. 10-2016-0164568, filed on Dec. 5, 2016, which is hereby incorporated by reference for all purposes as if fully set forth herein.

BACKGROUND

Field

The invention relates generally to a display device and a method for driving the same, and more specifically, to an organic light emitting display device and a method for driving the same that can improve image quality even in the case of low-driving frequency and/or when displaying low grayscale data.

Discussion of the Background

Display devices have become icons of modern information consuming societies. For instance, a liquid crystal display (LCD) device and organic light emitting display (OLED) device are widely used in mobile devices such as cell phones and tablet computers. Specifically, the OLED device is advantageous in that it has fast response speed, can provide luminance at high emission efficiency, and has a wide viewing angle. Recently, consumers demand has been trending toward flexible display devices allowing the display devices to be formed on a curved surface or even folded. The pixel of a conventional OLED device does not provide a functional structure capable of meeting these various requirements.

Generally, pixels in the display device are arranged in a matrix form, and generate light upon electrical activation from an array of transistors. The OLED device controls an amount of current provided to the organic light emitting diodes using transistors in respect pixels, and the organic light emitting diodes generate light having specific luminance according to the amount of current provided thereto. Such transistors can be categorized into two primary types, an amorphous silicon (a-Si) transistor having a-Si active layer and a polycrystalline silicon (poly-Si) transistor having poly-Si active layer.

The a-Si transistor generally has lower carrier mobility than that of the poly-Si transistor. Thus, making a high speed drive circuit such as pixel circuit for a display is difficult with the a-Si transistors. On the other hand, even though the carrier mobility of poly-Si transistor is higher than the a-Si transistor by as much as 100 times, the poly-Si transistor has a weakness which has variations in its threshold voltage (Vth) due to a grain boundary. Such non-uniform threshold voltages may result in display non-uniformity. Therefore, the pixel circuit including the poly-Si transistor generally requires a complex compensation circuit.

The above information disclosed in this Background section is only for enhancement of understanding of the background of the inventive concepts, and, therefore, it may contain information that does not constitute prior art.

SUMMARY

Exemplary embodiments of this invention solve one of more of the foregoing problems, avoid one or more of the drawbacks of conventional device/methods, and/or satisfy one or more of the foregoing needs by improving image quality even in the case of low-frequency driving or when displaying low grayscale data.

Additional aspects will be set forth in the detailed description which follows, and, in part, will be apparent from the disclosure, or may be learned by practice of the inventive concept.

According to one aspect of the invention, a display device constructed according to the principles of the invention includes pixels configured to emit light of various intensity in accordance with driving signals, data lines to communicate the driving signals to the pixels, scan lines to communicate scan signals to select one or more of pixels to receive the driving signals, and a power supply unit configured to supply at least one driving voltage to the pixels. At least one of the pixels may comprise a switching transistor having a first electrode connected to one of the data lines and a second electrode connected to a first node, and a gate electrode connected to one of the scan lines, a driving transistor connected between the power supply unit and an organic light emitting diode, a storage capacitor having a first terminal connected to the first node and a second terminal connected to a gate electrode of the driving transistor, and a first transistor connected between the first node and a first electrode of the driving transistor.

The switching transistor may comprise an oxide transistor having first and second gate electrodes, each of which is connected to and receives the same scan signal from one of the scan lines.

At least one pixel may further comprise a second transistor having a gate electrode connected to the scan line, a first electrode connected to a gate electrode of the driving transistor, and a second electrode connected to a second electrode of the driving transistor.

The second transistor may comprise an oxide transistor having first and second gate electrodes connected to the scan line to receive the same scan signal.

The power supply unit may include an initial voltage terminal configured to supply an initial voltage to the pixels, and the at least one pixel may further comprise a third transistor having a gate electrode connected to one of the scan lines, a first electrode connected to the initial voltage terminal, and a second electrode connected to the first electrode of the driving transistor.

The third transistor may comprise an oxide transistor having first and second gate electrodes connected to the one scan line to receive the same scan signal.

At least one pixel may further comprise a fourth transistor having a gate electrode connected to a first control line, a first electrode connected to the power supply unit, and a second electrode connected to a second electrode of the driving transistor.

According to another aspect of the invention, a display device includes pixels configured to emit light of various intensity in accordance with driving signals, data lines to communicate the driving signals to the pixels, scan lines to communicate scan signals to select one or more of the pixels to receive the driving signals, and a power supply unit configured to supply at least one driving voltage to the pixels. At least one of the pixels may comprise a switching transistor receiving a scan signal through one of the scan lines, and having a first electrode connected to a data line and a second electrode connected to a first node, a driving transistor comprising an oxide transistor connected between the power supply unit and an organic light emitting diode, and having first and second gate electrodes connected to separate lines to receive different signals, and a storage capacitor having a first terminal connected to the first node and a second terminal connected to one of the first and second gate electrodes of the driving transistor.

The first gate electrode of the driving transistor may be connected to the second terminal of the storage capacitor, and the second gate electrode of the driving transistor is connected to a third terminal.

The third terminal may be electrically coupled to a cathode of the organic light emitting diode.

The second terminal of the storage capacitor may be connected to the second gate electrode of the driving transistor.

The driving transistor may have an oxide semiconductor layer, a first insulating layer having a first thickness and disposed between the first gate electrode and the oxide semiconductor layer, and a second insulating layer having a second thickness and disposed between the second gate electrode and the oxide semiconductor layer, and wherein the first thickness is less than the second thickness.

The pixel may further comprise a first transistor connected between the first node and a first electrode of the driving transistor, a second transistor having a gate electrode connected to one of the scan lines, a first electrode connected to the second terminal of the storage capacitor, and a second electrode connected to a second electrode of the driving transistor, a third transistor having a gate electrode connected to one of the scan lines, a first electrode connected to an initial voltage terminal, and a second electrode connected to the first electrode of the driving transistor, and a fourth transistor connected between the power supply unit and the second electrode of the driving transistor.

According to another aspect of the invention, an exemplary method of the invention includes the steps of: initializing a gate electrode of a driving transistor with a first driving voltage in accordance with a scan signal and a first control signal, initializing a first electrode of the driving transistor with a second driving voltage in accordance with the scan signal, the second driving voltage having a level lower than the first driving voltage level, providing a data signal to a first node of a storage capacitor connected between the first node and the gate electrode of the driving transistor in accordance with a scan signal, applying the data signal to the first electrode of the driving transistor in accordance with a second control signal.

The step of applying the data signal to the first electrode of the driving transistor in accordance with a second control signal may comprise allowing the first node to communicate with the first electrode of the driving transistor.

The step of providing a data signal to the first node may comprise disconnecting communication between the first node and the first electrode of the driving transistor.

The first control signal and the scan signals are periodic signals having low and high states and the first control signal is high during part of the time when the scan signal is high. The part of the time may occur at substantially the same time as the step of initializing a gate electrode of the driving transistor.

The first control signal and the scan signals are periodic signals having low and high states and the first control signal is low during part of the time when the scan signal is high. The part of the time may occur at substantially the same time as the step of initializing a gate electrode of the driving transistor.

The second control signal and the scan signals are periodic signals having low and high states and the second control signal is low during substantially all of the time when the scan signal is high.

The second control signal and the scan signals are periodic signals having low and high states and the second control signal is high during substantially all of the time when the scan signal is high.

Accordingly, exemplary embodiments provide a display device including at least one pixels that may include a double gate oxide transistor as a switching transistor having first and second gate electrodes connected to the scan line to receive the same scan signal in order to improve image quality even in the case of low-frequency driving Exemplary embodiments also provide a display device including at least one pixel that may include a double gate oxide transistor as a driving transistor having first and second gate electrode connected to separate lines to receive different signals in order to improve image quality when displaying low grayscale data.

Exemplary embodiments also provide a method for driving a display device with a pixel including at least one oxide transistor in order to improve image quality while satisfying various requirments depending on the characteristics of transistors in the pixel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
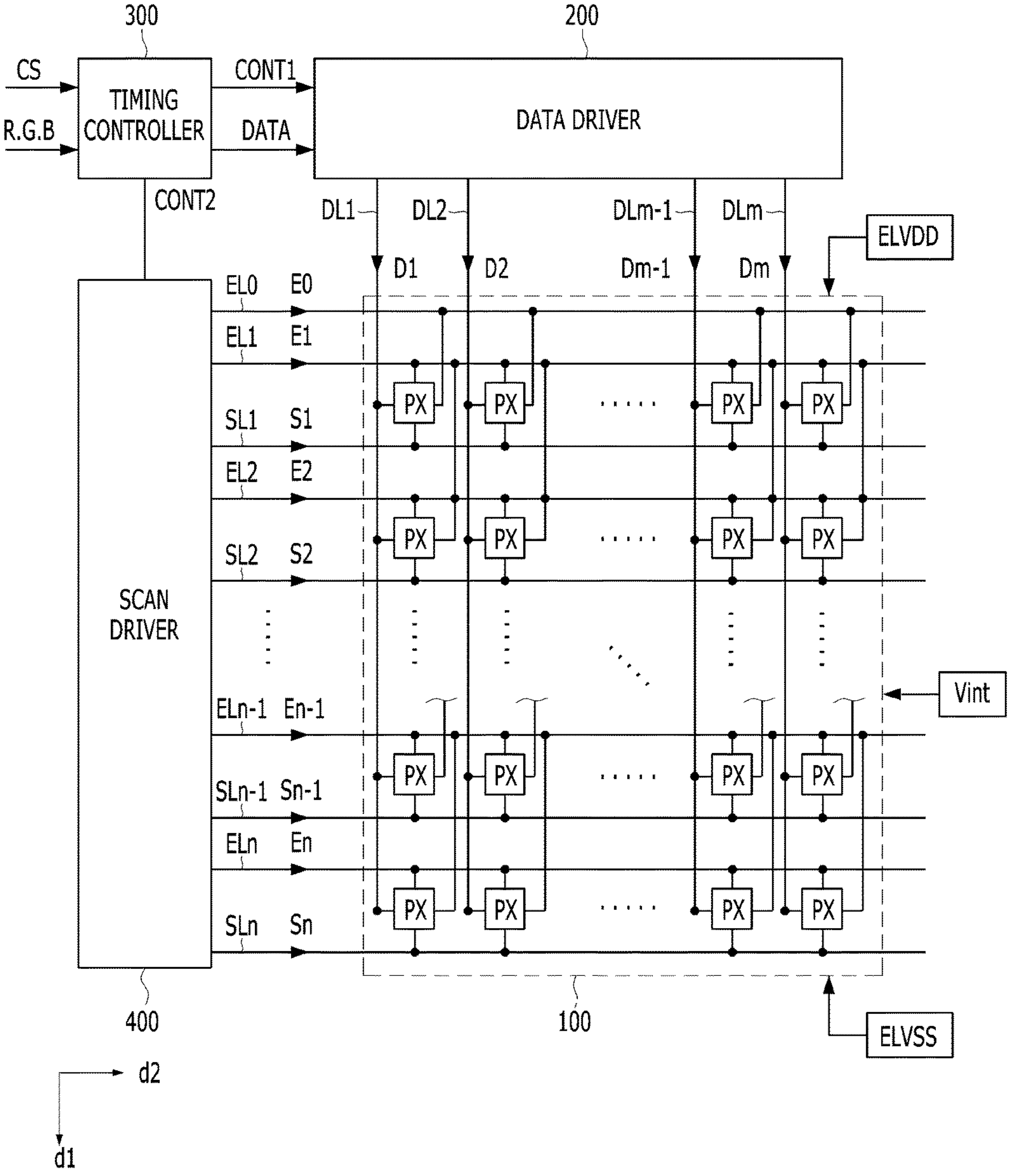
FIG. 1 is a block diagram of a display device according to one or more exemplary embodiments of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a block diagram of a display device according to one or more exemplary embodiments of the invention.

The display device may include a liquid crystal display (LCD) or an organic light emitting display (OLED). More specifically, a flexible display device such as foldable display and wearable display may include OLED device. For descriptive purpose, the OLED device will be described hereafter. However, the exemplary embodiments are not necessarily limited thereto, and therefore, the display device according to the exemplary embodiments may include various type of display.

Referring to FIG. 1, a display device includes display panel 100, data driver 200, timing controller 300, scan driver 400, and a power supply unit (not illustrated).

Display panel 100 may be a region where an image is displayed. Display panel 100 may include a plurality of data lines DL1 to DLm (where, m is a natural number that is larger than "1"), a plurality of scan lines SL1 to SLn that extend across (but are not electrically connected to) the plurality of data lines DL1 to DLm, and a plurality of emission control lines EL1 to ELn (where, n is a natural number that is larger than "1"). Further, display panel 100 may include a plurality of pixels PX arranged in a region where the plurality of data lines DL1 to DLm, the plurality of scan lines SL1 to SLn, and the plurality of emission control lines EL1 to ELn extend across (but are not electrically connected to) each other. In an embodiment, the plurality of the pixels may be arranged in the form of a matrix. The plurality of data lines DL1 to DLm may extend in a first direction d1, and the plurality of scan lines SL1 to SLn and the plurality of emission control lines EL1 to ELn may extend in a second direction d2 that intersects the first direction d1. Referring to FIG. 1, the first direction d1 may be a column direction, and the second direction d2 may be a row direction.

Each of the plurality of pixels PX may be connected to one of the plurality of data lines DL1 to DLm, one of the plurality of scan lines SL1 to SLn, and at least one of the plurality of emission control lines EL1 to ELn. Further, one of the plurality of pixels PX, which is connected to the i-th (where, i is a natural number that is equal to or larger than "2") emission control line ELi may also be connected to the (i−1)-th emission control line SLi−1 among the plurality of emission control lines EL1 to ELn. This will be described in detail with reference to FIG. 2. On the other hand, one of the plurality of pixels PX, which is connected to the 1st emission control line EL1, may also be connected to the $0^{th}$ emission control line EL0. In this case, the $0^{th}$ emission control line SL0 may be a dummy emission control line.

The plurality of pixels PX may receive a plurality of scan signals S1 to Sn from the plurality of scan lines SL1 to SLn, a plurality of data signals DL1 to DLm from the plurality of data lines S11 to DLn, and a plurality of emission control signals E1 to En from the plurality of emission control lines EL1 to ELn. On the other hand, each of the plurality of pixels PX may be connected to a first power terminal ELVDD through a first power line, and may be connected to a second power terminal EVLSS through a second power line. Further, each of the plurality of pixels PX may be connected to an initial voltage terminal (Vint in FIG. 2).

The power supply unit is configured to supply at least one driving voltage (ELVDD, ELSSS, and Vint) to the pixels PX. Thus, the power supply unit may include the first power terminal, the second power terminal, and the initial voltage terminal. Each of the plurality of pixels PX may control an amount of current that flows from the first power terminal ELVDD to the second power terminal ELVSS in accordance with the data signals D1 to Dm that are provided from the first power terminal and the plurality of data lines DL1 to DLm. Hereinafter, the first power terminal and the first driving voltage that is provided from the first power terminal are all denoted by ELVDD, the second power terminal and the second driving voltage that is provided from the second power terminal are all denoted by ELVSS and the initial voltage terminal and the initial voltage that is provided from the initial voltage terminal are all denoted by Vint.

Data driver 200 may be connected to display panel 100 through the plurality of data lines DL1 to DLm. Data driver 200 may provide the data signals D1 to Dm to the data lines DL1 to DLm according to a control signal CONT1 that is provided from the timing controller 300. Switching transistors SW (see FIG. 2) in the plurality of pixels may be turned on by the low-level scan signals. The organic light emitting diodes OLED in the plurality of pixels PX emit light of varying intensity according to a grayscale in accordance with the received data signals to display a image, as is known in the art.

Timing controller 300 may receive a control signal CS and image signals R, G, and B from an external system. The control signal CS may include a vertical sync signal Vsync and a horizontal sync signal Hsync. The image signals R, G, and B include luminance information of the plurality of pixels PX. The luminance of the grayscale may have 1024, 256, or 64 gray levels. Timing controller 300 may divide the image signals R, G, and B in the unit of a frame according to the vertical sync signal Vsync, and may divide the image signals R, G, and B in the unit of a scan line according to the horizontal sync signal Hsync to generate image data DATA. Timing controller 300 may provide control signals CONT1 and CONT2 to data driver 200 and scan driver 400 according to the control signal CS and the image signals R, G, and B. Timing controller 300 may provide the image data DATA to data driver 200 together with the control signal CONT1, and data driver 200 may generate the plurality of data signals D1 to Dm through sampling and holding of the input image data DATA according to the control signal CONT1 and converting of the image data into an analog voltage.

Scan driver 400 may be connected to display panel 100 through the plurality of scan lines SL1 to SLn and the plurality of control lines EL1 to ELn. Scan driver 400 may sequentially apply the plurality of scan signals S1 to Sn to the plurality of scan lines SL1 to SLn according to the control signal CONT2 provided from timing controller 300. Further, scan driver 400 may provide the plurality of emission control signals E1 to En to the plurality of pixels PX through the plurality of emission control lines EL1 to ELn. In this case, the first data line DL1 and the first emission control line EL1 may be connected to the pixels in the same column group. In this example, scan driver 400 provides the plurality of emission control signals E1 to En to the plurality of pixels PX, but other configurations may be used as apparent to the skilled artisan. For example, the plurality of emission control signals E1 to En may be provided through a separate integrated circuit IC and the emission control lines EL1 to ELn connected thereto.

The power supply unit (not illustrated) may provide driving voltages to the plurality of pixels PX according to the control signal provided from timing controller 300. The first and second power terminals ELVDD and ELVSS may provide driving voltages required for the operation of the plurality of pixels PX. The power supply unit may also provide the initial voltage Vint to the plurality of pixels PX. Here, the first driving voltage ELVDD may be a high level voltage, and the second driving voltage ELVSS and the initial voltage Vint may be low level voltages.

Unlike the power line that is connected to the first power terminal, the line that provides the initial voltage Vint may not form a current path across each pixel unit. That is, the initial voltage terminal may supply a predetermined voltage (e.g. low level voltage) to the specific node (e.g. a node connected to a first electrode of the driving transistor DR and connected to the anode of the organic lighting emitting diode OLED in FIG. 2) in a pixel without forming a current path to other pixels, and the line that provides the initial voltage Vint may be arranged to be in parallel to the direction in which the plurality of data lines DL1 to DLm are arranged and to cross the direction in which the plurality of scan lines SL1 to SLn are arranged. Accordingly, the initial voltage Vint (see FIG. 2) may be independently provided to the respective pixels which are positioned in the rows that are selected by the plurality of scan signals S1 to Sn provided from the plurality of scan lines SL1 to SLn.

Figure 2:
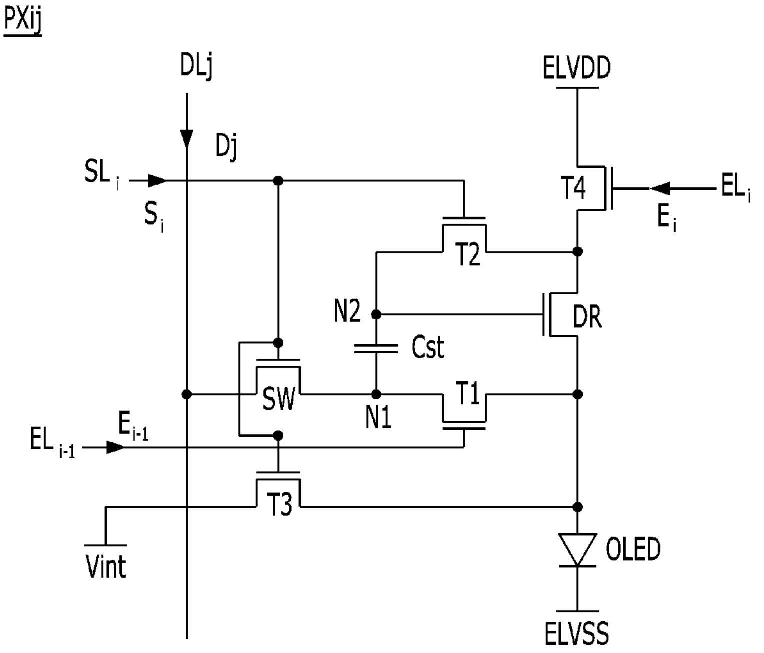
FIG. 2 is a circuit diagram of a pixel included in the configuration of the display device according to one or more exemplary embodiments.

FIG. 2 is a circuit diagram of a pixel included in the configuration of the display device according to one or more exemplary embodiments.

Specifically, FIG. 2 is a circuit diagram exemplarily illustrating a pixel unit PXij that is connected to the i-th (where, i is a natural number) scan line SLi, the j-th data line DLj, and the i-th emission control line ELi. Other pixels may have the same structure. However, the circuit construction of FIG. 2 is exemplary, and the circuit of the pixel unit PXij according to this embodiment may have other configurations.

Referring to FIG. 2, a pixel PXij according to one or more exemplary embodiments may include a switching transistor SW, a driving transistor DR, first to fourth transistors T1 to T4, a storage capacitor Cst, and an organic light emitting diode OLED.

The switching transistor SW may include a first electrode connected to the j-th data line Dj, a second electrode connected to a first node N1, and a gate electrode connected to the i-th scan line SLi. The switching transistor SW may be turned on by the i-th scan signal Si (of, e.g. a high level referring to FIG. 2) that is applied to the i-th scan line SLi to provide the j-th data signal Dj that is provided through the j-th data line DLj to the first node N1. The switching transistor SW may be an n-channel transistor. Thus, the switching transistor SW may be turned on by a scan signal of a high level, and may be turned off by a scan signal of a low level.

Here, the driving transistor DR and the first to fourth transistors T1 to T4 may all be n-channel transistors. Of course, p-channel transistors may be employed instead of any or all of the n-channel transistors in this circuit.

The driving transistor DR may include a first electrode connected to an organic light emitting diode OLED, a second electrode connected to a first power terminal ELVDD, and a gate electrode connected to a second node N2. The driving transistor DR may control an amount of current that is provided from the first power terminal ELVDD to the second power terminal ELVSS through the organic light emitting diode OLED according to the voltage that is applied to the second node N2.

The storage capacitor Cst may include a first terminal connected to the first node N1 and a second terminal connected to the gate electrode of the driving transistor DR, that is the second node N2. The storage capacitor Cst may be charged with a different voltage between the first and second nodes N1 and N2.

The first transistor T1 may include a first electrode connected to the first node N1 and a second electrode connected to the first electrode of the driving transistor DR, and may receive a second control signal through a gate electrode thereof. The gate electrode of the first transistor T1 may be connected to the (i−1)-th emission control line ELi−1. Accordingly, the second control signal may be the (i−1)-th emission control signal Ei−1 that is provided from the (i−1)-th emission control line ELi−1. Hereinafter, the (i−1)-th emission control signal Ei−1 is denoted as the second control signal and the (i−1)-th emission control signal line ELi−1 is denoted as the second control signal line. The first transistor T1 may be turned on according to the second control signal of a high level to transfer the data voltage at the first node N1 to the first is electrode of the driving transistor DR.

The second transistor T2 may include a first electrode connected to the gate electrode of the driving transistor DR (i.e. second node N2) and a second electrode connected to the second electrode of the driving transistor DR, and a gate electrode connected to the i-th scan line SLi. The second transistor T2 may be turned on according to the i-th scan signal Si of a high level to connect the driving transistor DR in the form of a diode. That is, when the second transistor T2 is turned on, the gate electrode and the second electrode of the driving transistor DR received the same voltage, the first driving voltage ELVDD. As illustrated above, the first driving voltage ELVDD may be a high level voltage.

The third transistor T3 may include a first electrode connected to the initial voltage terminal Vint, a second electrode connected to the first electrode of the driving transistor DR, and a gate electrode connected to the i-th scan line SLi. The third transistor T3 may be turned on by the i-th scan signal Si of a high level to provide the initial voltage Vint to the first electrode of the driving transistor DR. As illustrated above, the initial voltage Vint may be a low level voltage.

The fourth transistor T4 may include a first electrode connected to the first power terminal ELVDD, a second electrode connected to the second electrode of the driving transistor DR, and may receive a first control signal through a gate electrode thereof. The gate electrode of the fourth transistor T4 may be connected to the i-th emission control line ELi. Accordingly, the first control signal may be the i-th emission control signal Ei that is provided from the i-th emission control line ELi. Hereinafter, the i-th emission control signal Ei is denoted as the first control signal and the i-th emission control signal line ELi is denoted as the first control signal line. The fourth transistor T4 may apply the first driving voltage ELVDD to the second electrode of the driving transistor DR according to the first control signal (i.e. emission control signal Ei) of a high level that is provided through the gate electrode thereof. Further, the fourth transistor T4 may prevent driving current from flowing to the organic light emitting diode OLED according to the emission control signal Ei provided through the gate electrode thereof.

The organic light emitting diode OLED may include an anode connected to the first electrode of the driving transistor, a cathode connected to the second power terminal ELVSS. Further, The organic light emitting diode OLED may include an organic light emitting layer. The organic light emitting layer may emit light having one of primary colors, and the primary colors may be three primary colors of red, green, and blue. A desired color may be displayed through a spatial sum or temporal sum of the three primary colors. The organic light emitting layer may include low-molecular organic materials or high-molecular organic materials that correspond to the respective colors. In accordance with an amount of current that flows through the organic light emitting layer, the organic materials that correspond to the respective colors may emit light accordingly.

Figure 3:
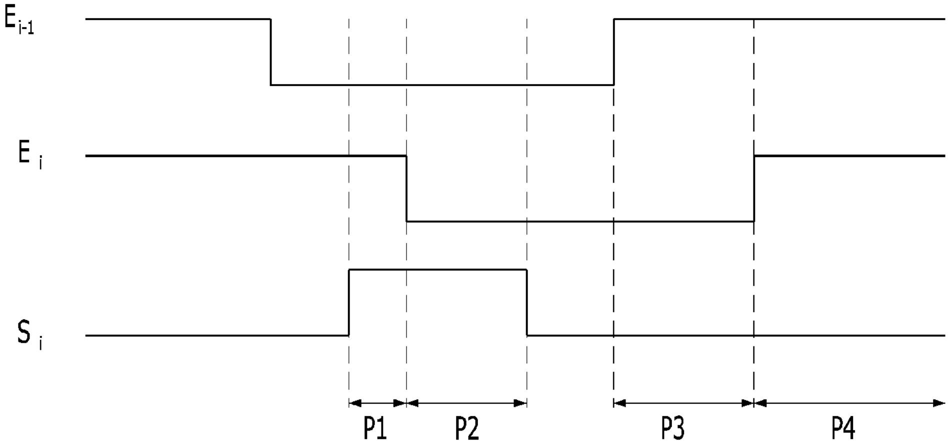
FIG. 3 is a timing diagram illustrating a method of driving the display device according to one or more exemplary embodiments.

FIG. 3 is a timing diagram illustrating a method of driving the display device according to one or more exemplary embodiments.

The organic light emitting display according to one or more exemplary embodiments may initialize the specific nodes connected to the driving transistor DR and compensate for the threshold voltage Vth of the driving transistor DR, and these initialization and compensation steps are performed during the time when the scan signal of a high level is applied. Further, after applying the scan signal, date voltage at the first node N1 is transferred to the first electrode of the driving transistor DR. In this case, the driving process of the pixel may include first period P1 to fourth period P4.

First, referring to FIGS. 2 and 3, in the first period P1, the switching transistor SW, the second transistor T2, and the third transistor T3 may be turned on according to the scan signal Si of a high level that is provided through the i-th scan line SLi. Further, the fourth transistor T4 may be turned on according to the first control signal (i.e., i-th emission control signal) Ei of a high level that is provided the i-th emission control line Eli. On the other hand, the first transistor T1 may be turned off according to the second control signal (i.e., (i−1)-th emission control signal) Ei of a low level that is provided the (i−1)-th emission control line ELi−1.

When the third transistor T3 is turned on, the initial voltage Vint may be applied to the anode of the organic light emitting diode OLED. The initial voltage Vint may be a low level voltage which is lower than the voltage level of ELVSS. Specifically, the voltage level of Vint may be lower than the summation of ELVSS and the threshold voltage of the OLED. Therefore, if the initial voltage Vint is applied to the anode of OLED, it may prevent light from emitting from the OLED. Also, when the second transistor T2 and the fourth transistor T4 are turned on, ELVDD of a high level may be applied to the second electrode and the gate electrode of the driving transistor DR, thereby the driving transistor may be operate as a diode. Thus, the driving transistor may be turned on, and then the current path from the first power terminal ELVDD to the initial voltage terminal Vint may be generated. As illustrated above, since the voltage level of Vint is lower than that of ELVSS, the current may be not go through the OLED and it may prevent light from emitting from the OLED. Further, when the switching transistor SW is turned on, the j-th data signal Dj that is provided through the j-th data line DLj may be applied to the first node N1. Therefore, during the first period P1, specific nodes (e.g. second node N2 and a node connected to the anode of the OLED) may be initialized, and the data signal is applied to the first node N1.

Next, in the second period P2, the switching transistor SW, the second transistor T2, and the third transistor T3 may be also turned on according to the scan signal Si of a high level that is provided through the i-th scan line SLi. On the other hand, the fourth transistor T4 may be turned off according to the first control signal (i.e., i-th emission control signal) Ei of a low level that is provided the i-th emission control line Eli, and the first transistor T1 may be turned off according to the second control signal (i.e., (i−1)-th emission control signal) Ei of a low level that is provided the (i−1)-th emission control line ELi−1.

When the fourth transistor T4 is turned off, ELVDD may not be applied to the second electrode of the driving transistor DR any more. However, since the second transistor T2 is still in the turned-on state and the initial voltage Vint of a low level is still applied to the second electrode of the driving transistor DR, the voltage level at the second node N2 connected to the gate electrode of the driving transistor DR may gradually decrease to the lower level until the driving transistor DR is turned off. To be specific, the voltage level at the second node N2 would be the summation of the initial voltage Vint and the threshold voltage (Vth) of the driving transistor DR, and then the driving transistor DR may be turned off. The voltage value at the second node N2 at the time when the driving transistor turned off may include the threshold voltage (Vth) of the driving transistor DR. Further, when the switching transistor SW is turned on, the j-th data signal Dj that is provided through the j-th data line DLj may be applied to the first node N1. Therefore, during the second period P2, the threshold voltage (Vth) of the driving transistor DR may be compensated, and the data signal is still applied to the first node N1.

Next, in the third period P3, the switching transistor SW, the second transistor T2, and the third transistor T3 may be turned off according to the scan signal Si of a low level that is provided through the i-th scan line SLi. Further, the fourth transistor T4 may be turned off according to the first control signal (i.e., i-th emission control signal) Ei of a low level that is provided the i-th emission control line ELi, whereas the first transistor T1 may be turned on according to the second control signal (i.e., (i−1)-th emission control signal) Ei of a high level that is provided the (i−1)-th emission control line ELi−1.

When the first transistor T1 is turned on according to the second control signal of a high level, the date voltage at the first node N1 is transferred to the first electrode of the driving transistor DR. Here, the data voltage may correspond to the data signal that is provided through the j-th data line DLj. The voltage level at the second node N2 may be the summation of the initial voltage Vint and the threshold voltage (Vth) of the driving transistor DR. The storage capacitor Cst may be charged with the difference in voltages between the first and second nodes N1 and N2. Accordingly, the first node N1 and the first electrode of the driving transistor may be the same node due to turning on of the first transistor T1. Therefore, during the third period P3, the date voltage at the first node N1 is applied to the first electrode of the driving transistor DR.

Finally, in the fourth period P4, the switching transistor SW, the second transistor T2, and the third transistor T3 may be turned off according to the scan signal Si of a low level that is provided through the i-th scan line SLi, whereas the fourth transistor T4 may be turned on according to the first control signal (i.e., i-th emission control signal) Ei of a high level that is provided the i-th emission control line ELi and the first transistor T1 may be turned on according to the second control signal (i.e., (i−1)-th emission control signal) Ei of a high level that is provided the (i−1)-th emission control line ELi−1.

When the first transistor T1 and the fourth transistor T4 are turned on and the switching transistor SW is turned off in the fourth period P4, the driving current that flows through the driving transistor DR may be applied to the organic light emitting diode OLED. The OLED may emit light according to this driving current. In the emission period (i.e. fourth period P4), the data voltage stored in the storage capacitor is supplied to the OLED. Accordingly, the OLED emits light with luminance proportional to the data voltage. As a result, the voltage value that is applied to the second node N2 may include a compensation voltage that is required to compensate for the threshold voltage Vth of the driving transistor DR, and the fourth period t4 may be a light emitting period. Therefore, the driving current that flows through the OLED is not affected by the threshold voltage Vth of the driving transistor DR.

Figure 4:
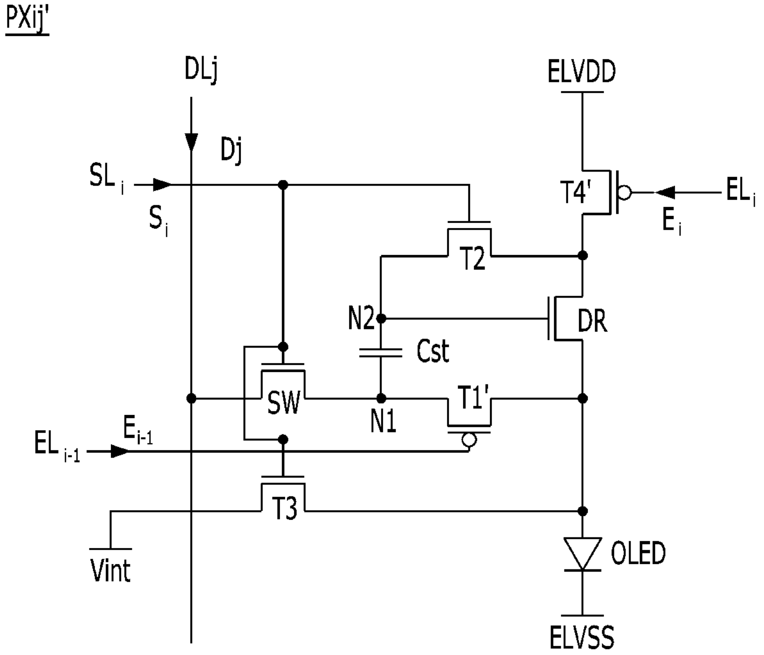
FIG. 4 is a circuit diagram of a pixel included in the configuration of the display device according to one or more exemplary embodiments.
Figure 5:
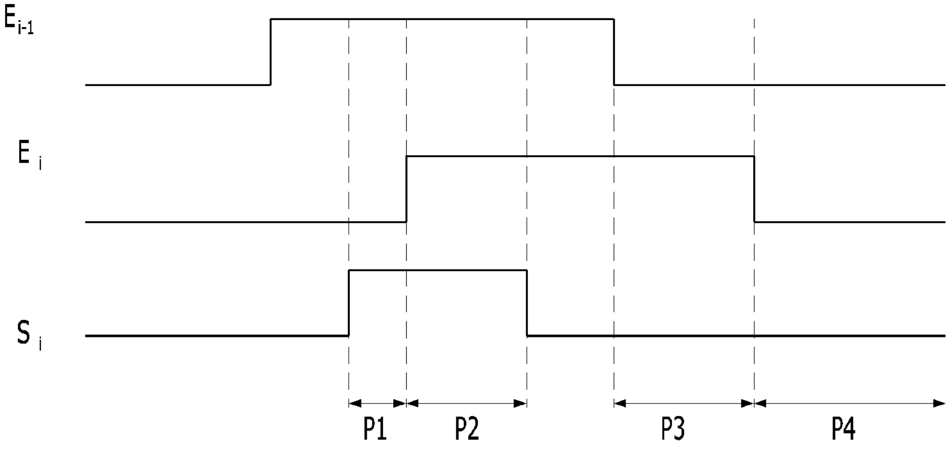
FIG. 5 is a timing diagram illustrating a method of driving the display device according to one or more exemplary embodiments.

FIG. 4 is a circuit diagram of a pixel included in the configuration of the display device according to one or more exemplary embodiments and FIG. 5 is a timing diagram illustrating a method of driving the display device according to one or more exemplary embodiments.

Compared to the pixel PXij illustrated in FIG. 2, a pixel PXij' illustrated in FIG. 4 includes one or more different type (i.e. p-channel) of transistors. To be specific, the transistor which receives the first or second control signal may be the p-channel transistor. For example, first transistor T1 and the fourth transistor T4 illustrated in FIG. 2 may be p-channel transistor. Accordingly, same reference numerals are used for the pixel PXij' in FIG. 4 to denote same elements of the PXij of FIG. 2. Further, their detailed descriptions are not repeated to avoid redundancy.

Referring to FIG. 4, the pixel PXij' according to one or more exemplary embodiments may include a switching transistor SW, a driving transistor DR, first to fourth transistor T1', T2, T3, and T4', a storage capacitor Cst, and an organic light emitting diode OLED. Here, the switching transistor SW, the driving transistor DR, the second transistor T2, and the third transistor T3 may be n-channel transistors, whereas the first transistor T1 and the fourth transistor T4 illustrated in FIG. 2 may be p-channel transistor.

The p-channel transistor may be turned on when a low level voltage is applied to the gate electrode thereof. Thus, referring to FIG. 5, the phase of the first and second control signal (i.e. i-th emission control signal Ei and (i−1)-th emission control signal Ei−1) is inverted when compared to the first and second control signal (i.e. i-th emission control signal Ei and (i−1)-th emission control signal Ei−1) illustrated in FIG. 3. That is, referring to FIG. 5, the first control signal Ei may be low during the first period P1, and the second control signal Ei−1 may be high during substantially all of the time when the scan signal is high (i.e. during the first period P1 and second period P2).

Figure 6:
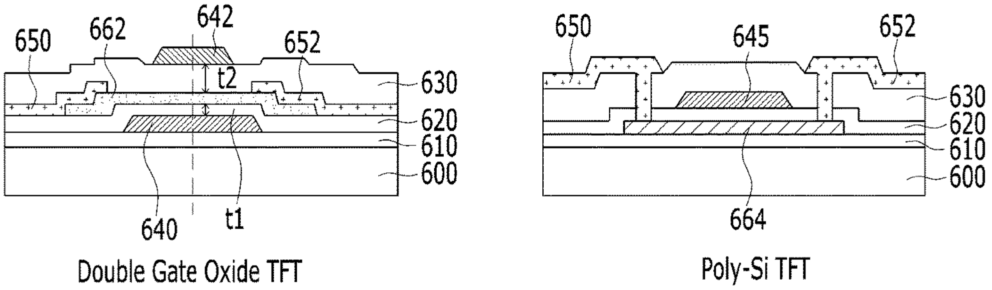
FIG. 6 is a cross-sectional view illustrating the structure of a double gate oxide transistor and a poly-Si transistor according to one or more exemplary embodiments.

FIG. 6 is a cross-sectional view illustrating the structure of a double gate oxide transistor and a poly-Si transistor according to one or more exemplary embodiments.

Referring to FIG. 6, a poly-Si thin film transistor (TFT) having a top gate structure includes a silicon semiconductor layer 664 as an active layer on a buffer layer 610 and a substrate 600. The silicon semiconductor layer 664 may be formed of poly silicon. Here, poly silicon may be formed by crystallizing amorphous silicon. A method of crystallizing amorphous silicon may be performed by rapid thermal annealing (RTA), solid phase crystallization (SPC), excimer laser annealing (ELA), metal induced crystallization (MIC), metal induced lateral crystallization (MILC), or sequential lateral solidification (SLS). The silicon semiconductor layer 664 may include a channel area in the center and doping areas outside the channel area doped with ion impurities. The doping areas of the silicon semiconductor layer 664 may contact a source electrode 650 and a drain electrode 652 through contact holes formed in a first insulating layer 620 and a second insulating layer 630.

The silicon semiconductor layer 664 has excellent electron mobility, but its leakage current characteristic is not good. As is known in the art, the leakage current (i.e. off current) of a transistor is an electric current that flows from the drain electrode of the transistor to the source electrode in the state in which the transistor has been turned off due to the gate-source potential of the transistor being less than the threshold voltage. For example, the leakage current of the switching transistor causes a voltage drop in the storage capacitor. Such a voltage drop of the storage capacitor causes a reduction in the luminance of the OLED. That is, the leakage current of the switching transistor causes a reduction in the luminance of the OLED. Therefore, an oxide semiconductor with excellent current leakage suppressing characteristics while having low electron mobility may be used as an active layer of a switching transistor to suppress occurrence of current leakage.

Referring to FIG. 6, a double gate oxide thin film transistor (TFT) includes a first gate electrode 640 formed on the buffer layer 610 and the substrate 600. In addition, an oxide semiconductor layer 662 as an active layer is formed on the first gate electrode 640 with the first insulating layer 620 therebetween.

The oxide semiconductor layer 662 may include an G-I—Z—O layer $[In_2O_3)_a(Ga_2O_3)_b(ZnO)_c$, where a, b, and c are numbers respectively satisfying conditions of a≥0, b≥0, c≥0], and in addition, may include of Groups 12, 12, and 14 metallic elements, such as zinc (Zn), indium (In), gallium (Ga), tin (Sn), cadmium (Cd), germanium (Ge), or hafnium (Hf), and a combination thereof. The both side areas of the oxide semiconductor layer 662 may contact a source electrode 650 and a drain electrode 652. The second insulating layer 630 is formed on the oxide semiconductor layer 662 and a second gate electrode 642 is formed on the second insulating layer 630 with overlapping the oxide semiconductor layer 652. The oxide TFT which is illustrated in FIG. 6 may include the oxide semiconductor layer 662, the first gate electrode 640 formed under the oxide semiconductor layer 662, and the second gate electrode 642 formed on the oxide semiconductor layer 664. Accordingly, the oxide TFT may be defined as a double gate oxide transistor. Here, as illustrated in FIG. 6, a thickness of the first insulating layer 620 (t1) is less than the thickness of the second insulating layer 630 (t2). For instance, the thickness of the first insulating layer 620 (t1) may be about 1400 Å, and the thickness of the second insulating layer 630 (t2) may be about 2600 Å. Thus, the first gate electrode 640 may be used as a main gate electrode (main-gate), and the second gate electrode 642 may be used as a sub gate electrode (sub-gate).

If both of the first gate electrode 640 and the second gate electrode 642 receive the same control signal (e.g. scan signal), the double gate oxide transistor may be operated as a double gate mode (DG mode). In the DG mode, since the control signal is applied to the second gate electrode as well as the first gate electrode, the oxide semiconductor layer may have two channels due to the control signal applied from both of the first and second gate electrode. Accordingly, the leakage current characteristic may be improved in the DG mode.

In addition, if only one of the first gate electrode 640 and the second gate electrode 642 receives the control signal, the double gate oxide transistor may be operated as a single gate mode (SG mode). The SG mode may be divided to $1^{st}$ SG mode and $2^{nd}$ SG mode. The $1^{st}$ SG mode is that the second gate electrode 642 only receives the control signal, and the $2^{nd}$ SG mode is that the first gate electrode 640 only receives the control signal. For example, in the $2^{nd}$ SG mode, when the first gate electrode 640 receives the control signal, the second gate electrode may receive the specific DC voltage to modulate the threshold voltage of the transistor. Therefore, a driving range of the oxide transistor may be adjusted properly in the SG mode.

Hereinafter, characteristics of the double gate oxide transistor will be described in detail with reference to FIGS. 7A, 7B, and FIG. 8.

Figure 7A:
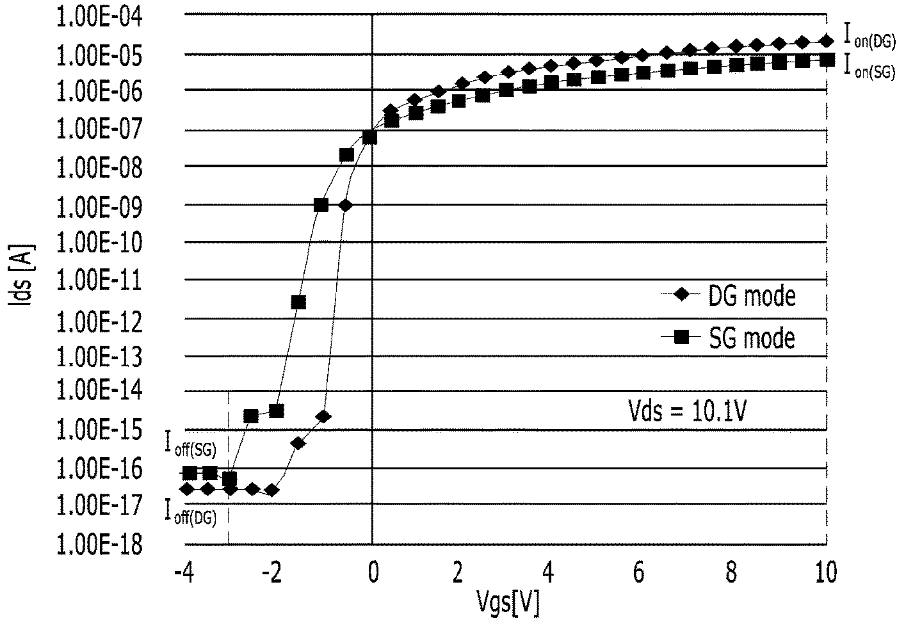
FIG. 7A and FIG. 7B are graphs explaining exemplary characteristics according to illustrative operational modes of the double gate oxide transistor illustrated in FIG. 6.
Figure 7B:
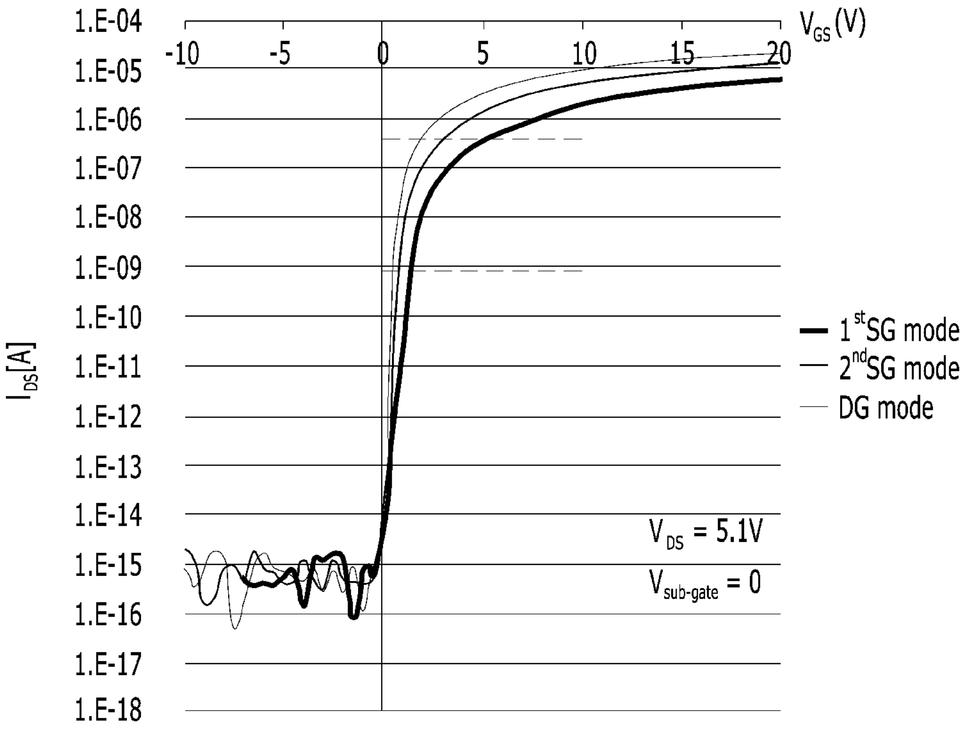
Figure 8:
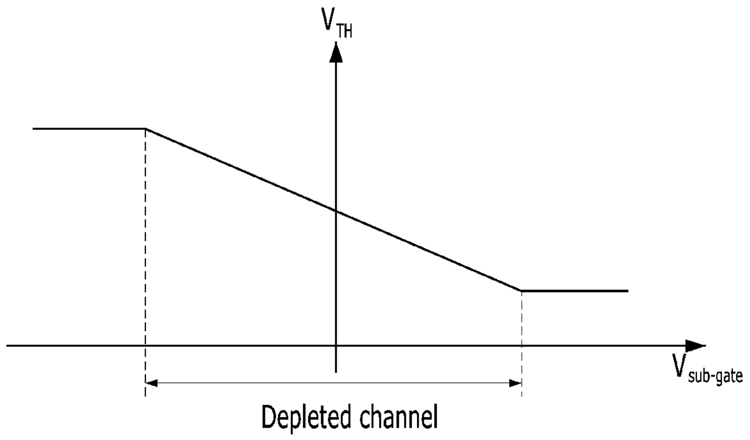
FIG. 8 is a graph explaining exemplary characteristics according to an illustrative operational model of single gate oxide transistor.

FIG. 7A and FIG. 7B are graphs explaining exemplary characteristics according to illustrative operational modes of the double gate oxide transistor illustrated in FIG. 6, and FIG. 8 is a graph explaining exemplary characteristics according to an illustrative operational mode of the double gate oxide transistor.

Referring to FIGS. 7A and 7B, x-axis shows the gate-source voltage (Vgs) of the double gate oxide transistor and y-axis shows the current flew between the source and the drain (Ids) of the double gate oxide transistor. Also, the voltage between the source and drain (Vds) in the FIG. 7A may be 10.1V. Similarly, the voltage between the source and drain (Vds) in the FIG. 7B may be 5.1V.

According to FIG. 7A, the double gate oxide transistor may have better leakage current (off current) characteristic in the DG mode. As explained above, the oxide semiconductor layer has two channels in the DG mode because of the control signal applied from both of the first and second gate electrode, whereas the oxide semiconductor layer only has one channel in the SG mode because one control signal applied from first gate electrode or second gate electrode. Accordingly, the leakage current characteristic may be better in the DG mode than in the SG mode.

Meanwhile, with respect to the driving range of the double gate oxide transistor, the double gate oxide transistor may have a wide driving range in the SG mode as illustrated in FIG. 7A.

To be specific, FIG. 7B illustrates various driving ranges according to the each of the operation modes. As explained above, the $1^{st}$ SG mode is that the second gate electrode 642 only receives the control signal (e.g., scan signal), and the first gate electrode is connected to ground (e.g. 0V). The $2^{nd}$ SG mode is that the first gate electrode 640 only receives the control signal, and the second gate electrode is connected to ground. The DG mode is that both of the first gate electrode 640 and the second gate electrode 642 receive the same scan signal.

According to FIG. 7B, when the Ids may have a value from 1 nA to 500 nA, the driving range of the double gate oxide transistor may be 1.5 V in the DG mode, 2.5V in the $2^{nd}$ SG mode, and 4.0V in the $1^{st}$ SG mode. Therefore, in the $1^{st}$ SG mode, the double gate oxide transistor may have about 2.67 times wider driving range than in the DG mode. Also, in the $1^{st}$ SG mode, the double gate oxide transistor may have about 1.6 times wider driving range than in the $2^{nd}$ SG mode.

Further, in the $2^{nd}$ SG mode, when the first gate electrode 640 receives the control signal, the second gate electrode may receive the specific DC voltage to modulate the threshold voltage of the transistor. Therefore, a driving range of the oxide transistor may be adjusted properly in the $2^{nd}$ SG mode.

Referring to FIG. 8, the x-axis shows the voltage applied to the sub-gate (i.e. the second gate electrode) and the y-axis shows the threshold voltage (Vth) in the depleted channel of the double gate oxide transistor. According to FIG. 8, if the negative voltage (or low level voltage) is applied to the sub-gate, the threshold voltage may be higher than the sub-gate voltage is 0V. In addition, the threshold voltage and the driving range of the double gate oxide transistor may have an inverse proportional relationship in the depleted channel as illustrated in FIG. 8. For example, if the threshold voltage of the double gate oxide transistor becomes higher, the double gate oxide transistor may have wider driving range.

Figure 9A:
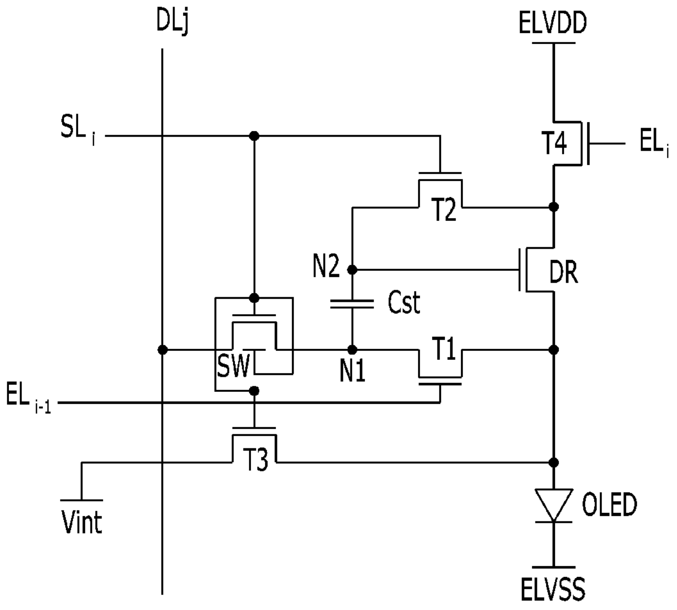
FIG. 9A and FIG. 9B are circuit diagrams of a pixel included in the configuration of the display device according to one or more exemplary embodiments in which the switching transistors are double gate oxide transistors.
Figure 9B:
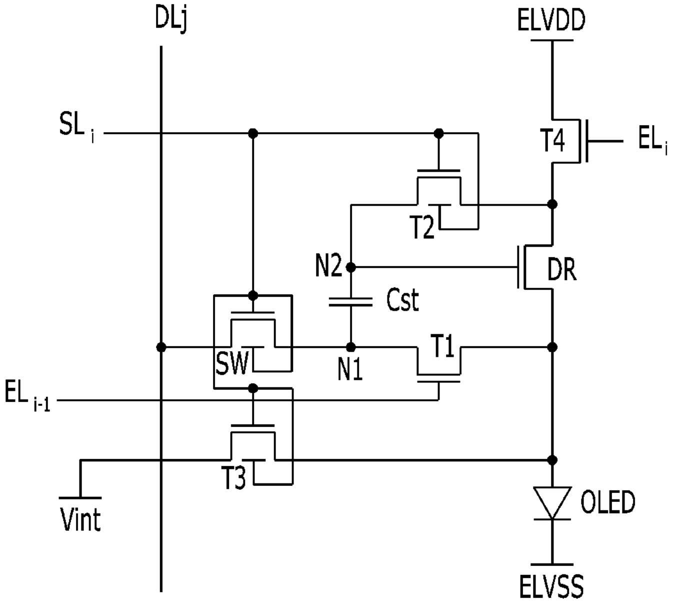

FIG. 9A and FIG. 9B are circuit diagrams of a pixel included in the configuration of the display device according to one or more exemplary embodiments in which the switching transistors are double gate oxide transistors.

Compared to the pixel PXij illustrated in FIG. 2, the pixel illustrated in FIG. 9A includes a double gate oxide transistor as a switching transistor SW and has its first and second gate electrodes connected to the scan line SLi to receive the same scan signal Si. In addition, the pixel illustrated in FIG. 9B has a second transistor T2 and a third transistor T3 formed as a double gate oxide transistor having first and second gate electrodes connected to the scan line SLi to receive the same scan signal Si as well as the switching transistor SW. FIG. 9B differs from FIG. 9A in that FIG. 9B also forms the second and third transistors T2 and T3 as the double gate oxide transistor having first and second gate electrodes connected to the scan line SLi to receive the same scan signal Si.

Accordingly, same reference numerals are used for the pixel in FIGS. 9A and 9B to denote same elements of the PXij of FIG. 2. Further, their detailed descriptions are not repeated to avoid redundancy.

Referring to FIGS. 9A and 9B, a pixel according to one or more exemplary embodiments may include a switching transistor SW, a driving transistor DR, first to fourth transistor T1 to T4, a storage capacitor Cst, and an organic light emitting diode OLED.

The switching transistor SW may include a first electrode connected to the j-th data line Dj, a second electrode connected to a first node N1, and a gate electrode connected to the i-th scan line SLi. The switching transistor SW may be turned on by the i-th scan signal Si (of, e.g. a high level referring to FIG. 2) that is applied to the i-th scan line SLi to provide the j-th data signal Dj that is provided through the j-th data line DLj to the first node N1.

Further, according to the FIGS. 9A and 9B, the switching transistor SW may be the double gate oxide transistor having first and second gate electrodes, each of which is connected to and receives the same scan signal Si from the scan line SLi. That is, the switching transistor SW may be the double gate oxide transistor in the DG mode.

As explained above, the leakage current characteristic may be improved in the DG mode. Accordingly, the switching transistor SW in FIGS. 9A and 9B may contribute to improve image quality even in the case of low-frequency driving.

Therefore, the display device having the pixel in the FIGS. 9A and 9B may be applied to a case where a driving frequency is greatly reduced to minimize consumption power in mobile device. For example, regarding display for a wearable watch, if the display is changed each second, a driving frequency of 1 Hz or close to a still image may be used.

The switching transistor SW may be an n-channel transistor. Thus, the switching transistor SW may be turned on by a scan signal of a high level, and may be turned off by a scan signal of a low level.

Furthermore, the driving transistor DR and the first to fourth transistors T1 to T4 may all be n-channel transistors. Meanwhile, some transistors such as the first transistor T1 and the fourth transistor T4 may be p-channel transistors as illustrated in FIG. 4.

The driving transistor DR may include a first electrode connected to an organic light emitting diode OLED, a second electrode connected to a first power terminal ELVDD, and a gate electrode connected to a second node N2. The driving transistor DR may control an amount of current that is provided from the first power terminal ELVDD to the second power terminal ELVSS through the organic light emitting diode OLED according to the voltage that is applied to the first node N2.

The storage capacitor Cst may include a first terminal connected to the first node N1 and a second terminal connected to the gate electrode of the driving transistor DR, that is the second node N2. The storage capacitor Cst may be charged with a difference voltage between the first and second nodes N1 and N2.

The first transistor T1 may include a first electrode connected to the first node N1 and a second electrode connected to the first electrode of the driving transistor DR, and may receive a second control signal (i.e. (i−1)-th emission control signal Ei−1) through a gate electrode thereof. The first transistor T1 may be turned on according to the second control signal to transfer the data voltage at the first node N1 to the first electrode of the driving transistor DR.

The second transistor T2 may include a first electrode connected to the gate electrode of the driving transistor DR (i.e. second node N2) and a second electrode connected to the second electrode of the driving transistor DR, and a gate electrode connected to the i-th scan line SLi. The second transistor T2 may be turned on according to the i-th scan signal Si of a high level to connect the driving transistor DR in the form of a diode.

According to the FIG. 9B, as noted above, the second transistor T2 may be a double gate oxide transistor having first and second gate electrodes, each of which is connected to and receives the same scan signal Si from the scan line SLi. That is, the second transistor T2 may be the double gate oxide transistor in the DG mode.

The third transistor T3 may include a first electrode connected to the initial voltage terminal Vint, a second electrode connected to the first electrode of the driving transistor DR, and a gate electrode connected to the i-th scan line SLi. The third transistor T3 may be turned on by the i-th scan signal Si of a high level to provide the initial voltage Vint to the first electrode of the driving transistor DR. As illustrated above, the initial voltage Vint may be low level voltage.

According to the FIG. 9B, the third transistor T3 may be the double gate oxide transistor having first and second gate electrodes, each of which is connected to and receives the same scan signal Si from the scan line SLi. That is, the third transistor T3 may be the double gate oxide transistor in the DG mode.

The fourth transistor T4 may include a first electrode connected to the first power terminal ELVDD, a second electrode connected to the second electrode of the driving transistor DR, and may receive a first control signal through a gate electrode thereof. The fourth transistor T4 may apply the first driving voltage ELVDD to the second electrode of the driving transistor DR according to the first control signal (i.e. i-th emission control signal Ei) that is provided through the gate electrode thereof in the first period P1. Further, the fourth transistor T4 may prevent driving current from flowing to the organic light emitting diode OLED according to the emission control signal Ei that is provided through the gate electrode thereof in the second and third period P2, P3.

The organic light emitting diode OLED may include an anode connected to the first electrode of the driving transistor, a cathode connected to the second power terminal ELVSS. In accordance with an amount of current that flows through the organic light emitting layer, the organic materials that correspond to the respective colors may emit light accordingly.

Figure 10A:
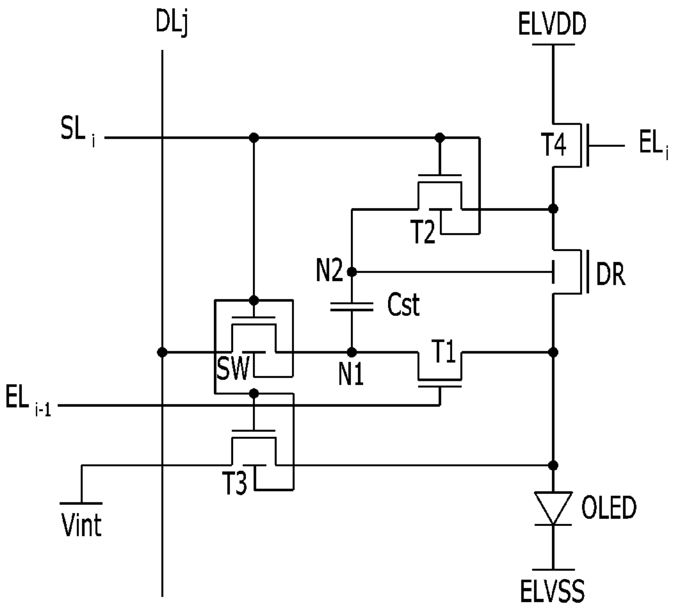
FIG. 10A and FIG. 10B are circuit diagrams of a pixel included in the configuration of the display device according to one or more exemplary embodiments in which the driving transistors for the OLED is double gate oxide transistor.
Figure 10B:
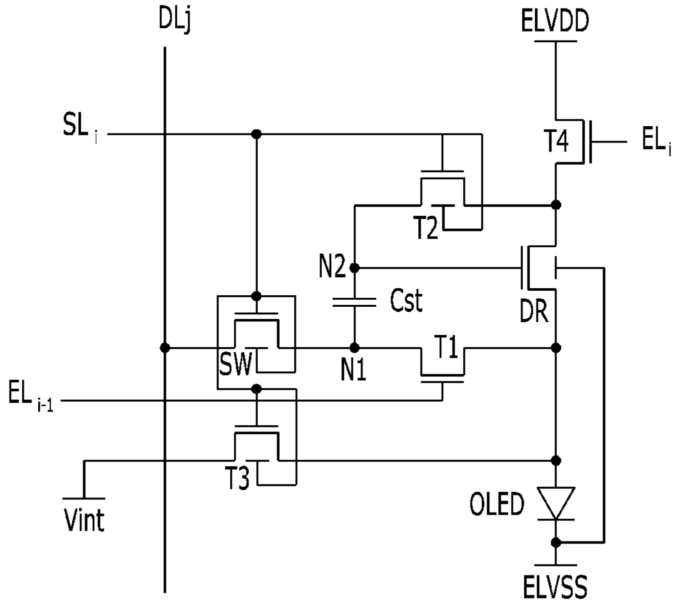

FIG. 10A and FIG. 10B are circuit diagrams of a pixel included in the configuration of the display device according to one or more exemplary embodiments in which the driving transistor for the OLED is double gate oxide transistor.

Compared to the pixel illustrated in FIG. 9B, a pixel illustrated in FIGS. 10A and 10B includes a double gate oxide transistor as a driving transistor DR having first and second gate electrodes connected to separate lines to receive different signals, which may improve image quality when displaying low grayscale data.

Accordingly, same reference numerals are used for the pixel in FIGS. 10A and 10B to denote same elements of the pixel of FIG. 9B. Further, their detailed descriptions are not repeated to avoid redundancy.

Referring to FIGS. 10A and 10B, a pixel according to one or more exemplary embodiments may include a switching transistor SW, a driving transistor DR, first to fourth transistor T1 to T4, a storage capacitor Cst, and an organic light emitting diode OLED.

Here, the switching transistor SW, the first to fourth transistor T1 to T4 in the pixel illustrated in FIGS. 10A and 10B are substantially same as the switching transistor SW, the first to fourth transistor T1 to T4 in the pixel illustrated in FIG. 9B. Accordingly, hereinafter, only the driving transistor DR will be described in detail with reference to FIGS. 10A and 10B.

Referring to FIG. 10A, the driving transistor DR may include a first electrode connected to an organic light emitting diode OLED, a second electrode connected to a first power terminal ELVDD. Also, the driving transistor may include a first gate electrode which is floating (or applied to 0V), and a second gate electrode connected to a second node N2.

Accordingly, the driving transistor DR may be a double gate oxide transistor in the 1$^{st}$ SG mode. Referring to FIG. 6, the first gate electrode 640 which is formed under the oxide semiconductor layer 652 may correspond to the first gate electrode of the driving transistor DR, and the second gate electrode 642 which is formed on the oxide semiconductor layer 652 may correspond to the second gate electrode of the driving transistor DR. Also, referring to FIG. 7B, the 1$^{st}$ SG mode may correspond to the driving transistor DR.

As explained above, the driving range of the double gate oxide transistor may be improved in the 1$^{st}$ SG mode. Accordingly, the driving transistor DR in FIG. 10A may contribute to improve image quality when displaying low grayscale data.

Next, referring to FIG. 10B, the driving transistor DR may include a first electrode connected to an organic light emitting diode OLED, a second electrode connected to a first power terminal ELVDD. Also, the driving transistor may include a first gate electrode connected to a second node N2, and a second gate electrode connected to the second power terminal ELVSS which is connected to the cathode of the OLED.

Accordingly, the driving transistor DR may be a double gate oxide transistor in the 2$^{nd}$ SG mode. Referring to FIG. 6, the first gate electrode 640 which is formed under the oxide semiconductor layer 652 may correspond to the first gate electrode of the driving transistor DR, and the second gate electrode 642 which is formed on the oxide semiconductor layer 652 may correspond to the second gate electrode of the driving transistor DR. Also, referring to FIG. 7B, the 2$^{nd}$ SG mode may correspond to the driving transistor DR. In addition, referring to FIG. 8, since the second gate electrode of the driving transistor DR receives the negative voltage (or low level voltage), the threshold voltage of the driving transistor DR may increase, thereby the driving transistor DR may have wider driving range.

As explained above, the driving range of the double gate oxide transistor may be improved in the 2$^{st}$ SG mode with modified threshold voltage. Accordingly, the driving transistor DR in FIG. 10B may contribute to improve image quality when displaying low grayscale data.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:

pixels configured to emit light of various intensity in accordance with driving signals;

data lines to communicate the driving signals to the pixels;

scan lines to communicate scan signals to select one or more of pixels to receive the driving signals; and a power supply to supply at least one driving voltage to the pixels;

wherein at least one of the pixels comprises:

a switching transistor having a first electrode connected to one of the data lines and a second electrode connected to a first node, and a gate electrode connected to one of the scan lines, a driving transistor connected between the power supply and an organic light emitting diode, a storage capacitor having a first terminal connected to the first node and a second terminal connected to a gate electrode of the driving transistor, a first transistor connected between the first node and a first electrode of the driving transistor, and a second transistor having a gate electrode connected to the scan line, the scan line being connected to the switching transistor.

2. The display device of claim 1, wherein the switching transistor comprises an oxide transistor having first and second gate electrodes, each of which is connected to and receives the same scan signal from one of the scan lines.

3. The display device of claim 1, wherein the second transistor further comprises a first electrode connected to a gate electrode of the driving transistor and a second electrode connected to a second electrode of the driving transistor.

4. The display device of claim 1, wherein the second transistor comprises an oxide transistor having first and second gate electrodes connected to the scan line to receive the same scan signal.

5. The display device of claim 1, wherein the power supply includes an initial voltage terminal configured to supply an initial voltage to the pixels, and the at least one pixel further comprises a third transistor having a gate electrode connected to one of the scan lines, a first electrode connected to the initial voltage terminal, and a second electrode connected to the first electrode of the driving transistor.

6. The display device of claim 5, wherein the third transistor comprises an oxide transistor having first and second gate electrodes connected to the one scan line to receive the same scan signal.

7. The display device of claim 1, wherein the at least one pixel further comprises a fourth transistor having a gate electrode connected to a first control line, a first electrode connected to the power supply, and a second electrode connected to a second electrode of the driving transistor.

8. A display device, comprising:

pixels configured to emit light of various intensity in accordance with driving signals;

data lines to communicate the driving signals to the pixels;

scan lines to communicate scan signals to select one or more of the pixels to receive the driving signals; and a power supply to supply at least one driving voltage to the pixels, wherein at least one of the pixels comprises:

a switching transistor receiving a scan signal through one of the scan lines, and having a first electrode connected to a data line and a second electrode connected to a first node, a driving transistor comprising an oxide transistor connected between the power supply and an organic light emitting diode, and having first and second gate electrodes connected to separate lines to receive different signals, the first gate electrode which is floating or applied to 0V, and a storage capacitor having a first terminal connected to the first node and a second terminal connected to the second gate electrode of the driving transistor.

9. The display device of claim 8, wherein the driving transistor has an oxide semiconductor layer, a first insulating layer having a first thickness and disposed between the first gate electrode and the oxide semiconductor layer, and a second insulating layer having a second thickness and disposed between the second gate electrode and the oxide semiconductor layer, and wherein the first thickness is less than the second thickness.

10. The display device of claim 8, wherein the switching transistor comprises an oxide transistor having first and second gate electrodes connected to the same scan line to receive the same scan signal.

11. The display device of claim 8, wherein the pixel further comprises:

a first transistor connected between the first node and a first electrode of the driving transistor, a second transistor having a gate electrode connected to one of the scan lines, a first electrode connected to the second terminal of the storage capacitor, and a second electrode connected to a second electrode of the driving transistor, a third transistor having a gate electrode connected to one of the scan lines, a first electrode connected to an initial voltage terminal, and a second electrode connected to the first electrode of the driving transistor, and a fourth transistor connected between the power supply Viand the second electrode of the driving transistor.

12. The display device of claim 11, wherein at least one of the second and third transistors comprises an oxide transistor having first and second gate electrodes connected to the same scan line to receive the same scan signal.

13. A method for driving an display device, the method comprising:

initializing a gate electrode of a driving transistor with a first driving voltage in accordance with a scan signal and a first control signal;

initializing a first electrode of the driving transistor with a second driving voltage in accordance with the scan signal, the second driving voltage having a level lower than the first driving voltage level;

providing a data signal to a first node of a storage capacitor connected between the first node and the gate electrode of the driving transistor in accordance with a scan signal;

applying the data signal to the first electrode of the driving transistor in accordance with a second control signal.

14. The method of claim 13, wherein the step of applying the data signal to the first electrode of the driving transistor in accordance with a second control signal comprises allowing the first node to communicate with the first electrode of the driving transistor.

15. The method of claim 13, wherein the step of providing a data signal to the first node comprises disconnecting communication between the first node and the first electrode of the driving transistor.

16. The method of claim 13, wherein the first control signal and the scan signals are periodic signals having low and high states and the first control signal is high during part of the time when the scan signal is high.

17. The method of claim 16, wherein the part of the time occurs at substantially the same time as the step of initializing a gate electrode of the driving transistor.

18. The method of claim 13, wherein the first control signal and the scan signals are periodic signals having low and high states and the first control signal is low during part of the time when the scan signal is high.

19. The method of claim 18, wherein the part of the time occurs at substantially the same time as the step of initializing a gate electrode of the driving transistor.

20. The method of claim 13, wherein the second control signal and the scan signals are periodic signals having low and high states and the second control signal is low during substantially all of the time when the scan signal is high.

21. The method of claim 13, wherein the second control signal and the scan signals are periodic signals having low and high states and the second control signal is high during substantially all of the time when the scan signal is high.

22. A display device, comprising:

pixels configured to emit light of various intensity in accordance with driving signals;

data lines to communicate the driving signals to the pixels;

scan lines to communicate scan signals to select one or more of the pixels to receive the driving signals; and a power supply to supply at least one driving voltage to the pixels, wherein at least one of the pixels comprises:

a switching transistor receiving a scan signal through one of the scan lines, and having a first electrode connected to a data line and a second electrode connected to a first node, a driving transistor comprising an oxide transistor connected between the power supply and an organic light emitting diode, and having first and second gate electrodes connected to separate lines to receive different signals, the second gate electrode being electrically connected to a cathode of the organic light emitting diode, and a storage capacitor having a first terminal connected to the first node and a second terminal connected to the first gate electrode of the driving transistor.

* * * * *